United States Patent
Nieto

(10) Patent No.: US 7,620,881 B2
(45) Date of Patent: Nov. 17, 2009

(54) SYSTEM AND METHOD FOR COMMUNICATING DATA USING ITERATIVE EQUALIZING AND DECODING AND RECURSIVE INNER CODE

(75) Inventor: John W. Nieto, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 485 days.

(21) Appl. No.: 11/076,170

(22) Filed: Mar. 9, 2005

(65) Prior Publication Data

US 2006/0206776 A1    Sep. 14, 2006

(51) Int. Cl.
*H03M 13/00* (2006.01)
*H03M 13/03* (2006.01)

(52) U.S. Cl. ........................ 714/794; 714/755; 714/795

(58) Field of Classification Search ................. 714/755, 714/794, 795
See application file for complete search history.

(56) References Cited

U.S. PATENT DOCUMENTS

| | | | |
|---|---|---|---|
| 5,446,747 A | 8/1995 | Berrou | 371/45 |
| 6,029,264 A * | 2/2000 | Kobayashi et al. | 714/755 |
| 6,513,140 B2 * | 1/2003 | Dotsch et al. | 714/786 |
| 6,629,287 B1 * | 9/2003 | Brink | 714/755 |
| 6,765,507 B2 * | 7/2004 | Yokokawa et al. | 341/50 |
| 6,956,838 B2 * | 10/2005 | Ertel et al. | 370/334 |
| 7,089,477 B1 * | 8/2006 | Divsalar et al. | 714/755 |
| 7,116,710 B1 * | 10/2006 | Jin et al. | 375/240 |
| 7,155,171 B2 * | 12/2006 | Ebert et al. | 455/67.14 |
| 7,243,294 B1 * | 7/2007 | Divsalar et al. | 714/792 |
| 2001/0017904 A1 | 8/2001 | Pukkila et al. | 375/350 |
| 2002/0034261 A1 * | 3/2002 | Eidson et al. | 375/298 |
| 2002/0163978 A1 | 11/2002 | Doetsch et al. | 375/316 |
| 2002/0168017 A1 | 11/2002 | Berthet et al. | 375/267 |
| 2003/0118122 A1 | 6/2003 | Nefedov | 375/265 |

* cited by examiner

Primary Examiner—Joseph D Torres
(74) Attorney, Agent, or Firm—Allen, Dyer, Doppelt, Milbrath & Gilchrist, P.A.

(57) ABSTRACT

A system and method for communicating data includes an inner encoder for encoding data with the recursive inner rate one code. A modulator coherently modulates a communications signal that carries the data that has been encoded. An interleaver is operative with the inner encoder and modulator to aid in removing correlation of multipath fading channels on consecutive bits. A convolutional encoder is followed by a random interleaver. The modulator can be operative with mini-probe sequences. An equalizer and decoder receives the communications signal and iteratively decodes any recursive inner rate one code and convolutional code in a turbo fashion.

7 Claims, 4 Drawing Sheets

SYSTEM AND METHOD FOR COMMUNICATING DATA USING ITERATIVE EQUALIZING AND DECODING AND RECURSIVE INNER CODE

FIELD OF THE INVENTION

The present invention relates to communications systems and, more particularly, the present invention relates to communications systems that use iterative equalization and decoding.

BACKGROUND OF THE INVENTION

Iterative equalization and decoding offers some significant performance advantages on multipath/fading channels. For example, an outer rate ½ K=7 convolutional code serially concatenated with a block interleaver was shown to provide significant improvements on multipath/fading High Frequency (HF) channels, where the multipath/fading channel behaved like a rate=1 non-recursive inner code. However, research in the area of serially concatenated iterative codes has shown that additional interleaver gains exist if the inner code is recursive.

It is well known that High Frequency, Very High Frequency and Ultra High Frequency (HF/VHF/UHF) tactical (land mobile) radio channels exhibit time and frequency dispersion (i.e., delay spread and Doppler spread) because of the presence of signal reflectors and scatterers in the environment and the relative motion of a transmitter and receiver. To obtain adequate interleaver gains in a serially-concatenated system, the inner code must be recursive. In single-carrier systems, this has historically meant that the modulation used over the channel is a differential modulation or Continuous Phase Modulation (CPM).

Some communications systems generate waveforms using a recursive inner rate one (1) code and differential modulation. These communications systems often use Forward Error Correcting (FEC) and interleaving to overcome the multipath and/or fading encountered in these communications channels, for example, in wireless networks, telephone lines and similar communications networks. Recent advances in demodulation techniques for typical high frequency communications systems, however, have used advances in demodulation techniques to yield improvements in system performance by using iterative equalization and decoding. This approach helps the demodulation process by feeding back decoded bits, which, in general will be of a higher quality than the on-air received bits. As a result, a Forward Error Correction (FEC) code is used to correct some of the errors caused by multipath, fading, and noises encountered on the communications channel.

Other communications systems use serially concatenated forward error correction codes, which are iteratively decoded. Instead of using a Forward Error Correction code as an inner code, a recursive modulation, such as a Continuous Phase Modulation (CPM), is used. This fulfills a key requirement of serially concatenated codes by allowing a recursive inner code to obtain interleaver gains in the iterative decoding process. As the constellation size is increased, however, and Phase Shift Key (PSK) or Quadrature Amplitude Modulation (QAM) used, differential modulation can be difficult to implement and can have large performance degradation, i.e., 16-QAM and 64-QAM.

SUMMARY OF THE INVENTION

In view of the foregoing background, it is therefore an object of the present invention to provide a system and method that uses coherent modulation and uses iterative equalization and decoding.

It is yet another object of the present invention to provide a system and method that removes the need for differential modulation in an iterative equalization and decoding system with a recursive inner code.

In accordance with the present invention, the communications system generates a waveform that uses a serial concatenation of a convolutional code, and a recursive inner rate one (1) code. Coherent modulation is used instead of a differential modulation. The recursive nature of the inner code provides significant gains in parallel and serially concatenated iterative codes.

In one aspect of the present invention, data to be transmitted can be encoded using a convolutional code. The data is passed through a random or block interleaver. The system encodes the data with a rate one (1) code and the data is passed through another interleaver. Multiple bits are gathered to generate transmit symbols based on a desired modulation, preferably a coherent modulation. At a receiver, a standard equalizer demodulates the data and passes the data through a deinterleaver. The system iteratively decodes the inner rate one (1) code and the outer convolutional code in turbo fashion. With every few iterations, it is possible to redo the equalization and channel estimate by feeding back the "latest" demodulated symbol estimates resulting from the turbo process and then continue the turbo decoding process with improved equalizer estimates.

A system and method for communicating data in accordance with the present invention includes an encoder for encoding data with the recursive inner rate one (1) code and modulator for coherently modulating a communications signal that carries the data that has been encoded. An interleaver is operative with the encoder and modulator to aid in removing correlation of multipath fading channels on consecutive bits. The equalizer receives the communications signal and produces soft information, which is iteratively decoded by recursive inner and outer codes in a turbo fashion.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
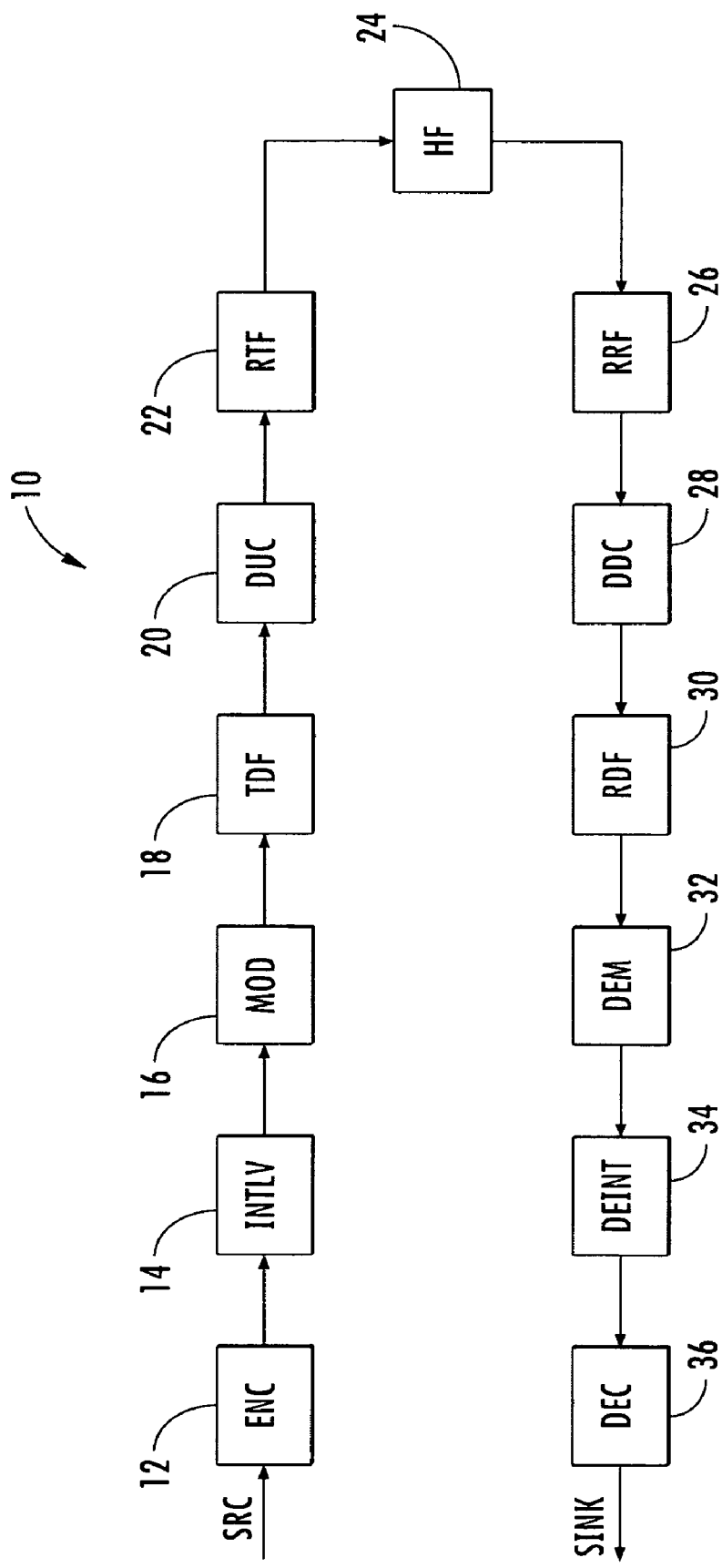
FIG. 1 is a block diagram of an example of a typical prior art high frequency communications system showing different modulators and demodulators, filters, interleavers, and deinterleavers, and forward error correction (FEC) encoders and decoders.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

The present invention advantageously provides a system and method for iterative equalization and decoding with a recursive inner code. The system and method of the invention generates a novel and unobvious waveform using a serial concatenation of a convolutional code and a recursive inner rate one code. It also uses coherent modulation instead of differential modulation.

The present invention removes the requirement for differential modulation in a system using iterative equalization and decoding by using a rate-equal-one recursive inner code stand-alone and placing an interleaver between it and a coherent modulation circuit. The interleaver helps remove the correlation of multipath fading channels on consecutive bits of the inner rate one code. The iterative demodulation process can exchange soft and hard information between the outer code, the inner code and the equalizer. Many different demodulation schemes can be used where multiple iterations could be run between different blocks that exchange soft and hard information. For example, the inner and outer code exchange information multiple times before the equalizer is included in the process. The equalizer could be used initially to generate the information provided to the inner code. This allows an improved performance for waveforms using interleavers and forward error correction (FEC) over communications channels with multipath and/or fading.

It should be understood that after turbo codes were used in the industry, serially concatenated codes with a pseudo-random bit interleaver were useful for iterative decoding. Some of these concatenated coding schemes used a simple carrier frequency modulation, for example, binary Phase Shift Keying. Bandwidth efficiency was improved using Trellis-Coded Modulation (TCM) and Continuous Phase Modulation (CPM), especially when a constant envelope of a transmitted signal was required, for example, when a transmitter amplifier was not linear.

Serially concatenated turbo codes satisfied the requirements for low-bit and word-error rates with reasonable complexity coding and decoding algorithms. These codes can be used with high-level modulations, for example, Octonary Phase Shift Keying (8 PSK) and 16-state quadrature amplitude modulation (16 QAM).

Trellis-coded modulation has become increasingly popular in digital communications. Turbo codes are also popular and combine binary component codes, typically including trellis codes with interleaving. Some turbo codes are formed as parallel concatenated convolutional codes using a constituent encoder joined by interleavers. Input information bits are fed to a first encoder, scrambled by an interleaver, and enter a second encoder. A code word of this parallel concatenated code usually has input bits to a first encoder followed by parity check bits of both encoders. Suboptimal iterative decoding can be modular and use concatenated decoder modules for each constituent code that is connected through an interleaver, usually identical to the type of interleaver on the encoder side. Each decoder could perform weighted soft decoding of an input sequence. Serial concatenation of codes separated by an interleaver provides similar performance benefits as parallel concatenation. The present invention advantageously benefits from this technology and improves on it.

For purposes of description, a typical high frequency communications system used for transmitting and receiving digital data is described with reference to FIG. 1. The system shown in FIG. 1 can use iterative equalization and decoding. The system and method of the present invention can employ this technology and adopt it and apply a recursive inner code.

As shown in FIG. 1 for this typical HF communications system 10 at a transmit section, a data stream (Src) that is to be transmitted is forwarded as 1's and 0's as is typical. The encoder 12 is operative as a Forward Error Correction (FEC) encoder and applies a FEC algorithm to the data, which passes to an interleaver 14, which interleaves the data, which is then modulated by a modulator 16. In some prior art systems having similar functions, differential modulation is applied at this point. The present invention can use coherent modulation in the modulator 16, for example. The modulator 16 could be a two, four or eight PSK modulator as a non-limiting example. Mini probe sequences can also be applied. The data is passed into a transmit digital low-pass filter 18, and the data is up-converted by a digital up-conversion circuit 20 from baseband to an 1800 Hz carrier in this one non-limiting example. A radio transmit filter (RTF) 22 limits the bandwidth of the transmit waveform to about 3 KHz. The data is passed to a high frequency, multi-path and fading channel simulator circuit (meant to simulate an HF channel) 24, where multi-path is modeled as a tapped-delay line, and each tap in the tapped-delay line has fading characteristics based on the Watterson model.

At a receiver section, a radio receive filter 26 limits the bandwidth of the data signal to about 3 KHz. The data is digitally down-converted in the converter 28 from 1800 Hz carrier to baseband in this non-limiting example. The data passes into a receive digital low-pass filter 30 that is ideally the same as the transmit digital low-pass filter (TDF) 18. The demodulation occurs in demodulator circuit 32 followed by deinterleaving within a deinterleaver circuit 34. The forward error correction (FEC) decoder circuit 36 decodes the data and passes it as a received bit stream (Sink).

Figure 2:
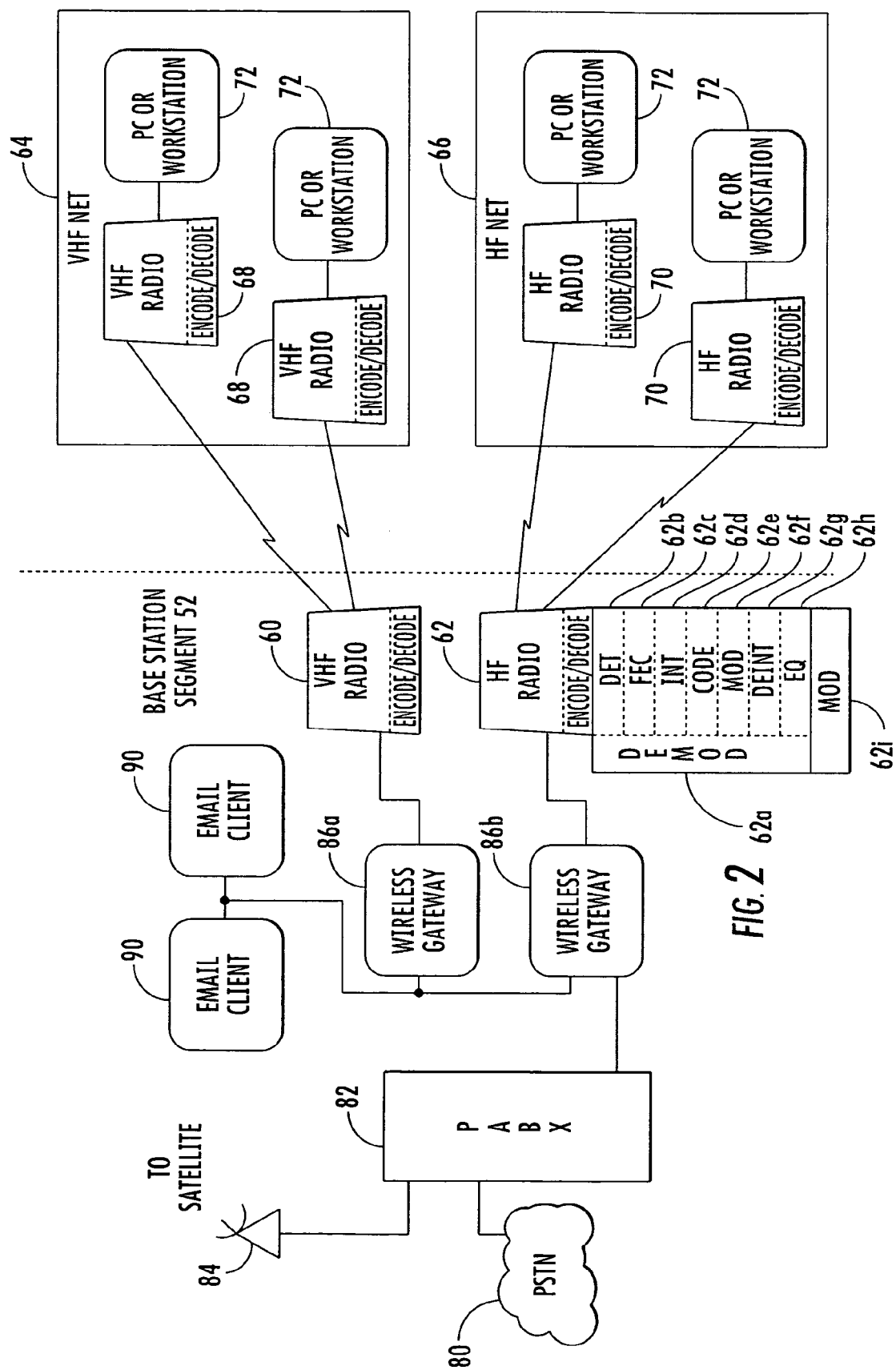
FIG. 2 is a block diagram of a communications system that can be used for the present invention as a non-limiting example.

For purposes of description only, a brief description of an example of a communications system that would benefit from the present invention is described relative to a non-limiting example shown in FIG. 2. This high level block diagram of a communications system 50 includes a base station segment 52 and wireless message terminals that could be modified for use with the present invention. The base station segment 52 includes a VHF radio 60 and HF radio 62 that communicate and transmit voice or data over a wireless link to a VHF net 64 or HF net 66, each which include a number of respective VHF radios 68 and HF radios 70, and personal computer workstations 72 connected to the radios 68,70. The HF radio can include a demodulator circuit 62a and appropriate detector circuit 62b, outer FEC circuit 62c, interleaver circuit 62d, coding circuit 62e, modulation circuit 62f, deinterleaver circuit 62g, equalizer circuit 62h and modem 62i as non-limiting examples. These and other circuits operate to perform the functions necessary for the present invention. Other illustrated radios can have similar circuits.

The base station segment 52 includes a landline connection to a public switched telephone network (PSTN) 80, which connects to a PABX 82. A satellite interface 84, such as a satellite ground station, connects to the PABX 82, which connects to processors forming wireless gateways 86a, 86b. These interconnect to the VHF radio 60 or HF radio 62, respectively. The processors are connected through a local area network to the PABX 82 and e-mail clients 90. The radios include appropriate signal generators and modulators.

An Ethernet/TCP-IP local area network could operate as a "radio" mail server. E-mail messages could be sent over radio links and local air networks using STANAG-5066 as second-generation protocols/waveforms, the disclosure which is hereby incorporated by reference in its entirety and, of course, preferably with the third-generation interoperability standard: STANAG-4538, the disclosure which is hereby incorporated by reference in its entirety. An interoperability standard FED-STD-1052, the disclosure which is hereby incorporated by reference in its entirety, could be used with legacy wireless devices. Examples of equipment that can be used in the present invention include different wireless gateway and radios manufactured by Harris Corporation of Melbourne, Fla. This equipment could include RF5800, 5022, 7210, 5710, 5285 and PRC 117 and 138 series equipment and devices as non-limiting examples.

These systems can be operable with RF-5710A high-frequency (HF) modems and with the NATO standard known as STANAG 4539, the disclosure which is hereby incorporated by reference in its entirety, which provides for transmission of long distance HF radio circuits at rates up to 9,600 bps. In addition to modern technology, those systems can use wireless email products that use a suite of data-link protocols designed and perfected for stressed tactical channels, such as the STANAG 4538 or STANAG 5066, the disclosures which are hereby incorporated by reference in their entirety. It is also possible to use a fixed, non-adaptive data rate as high as 19,200 bps with a radio set to ISB mode and an HF modem set to a fixed data rate. It is possible to use code combining techniques and ARQ.

Figure 3:
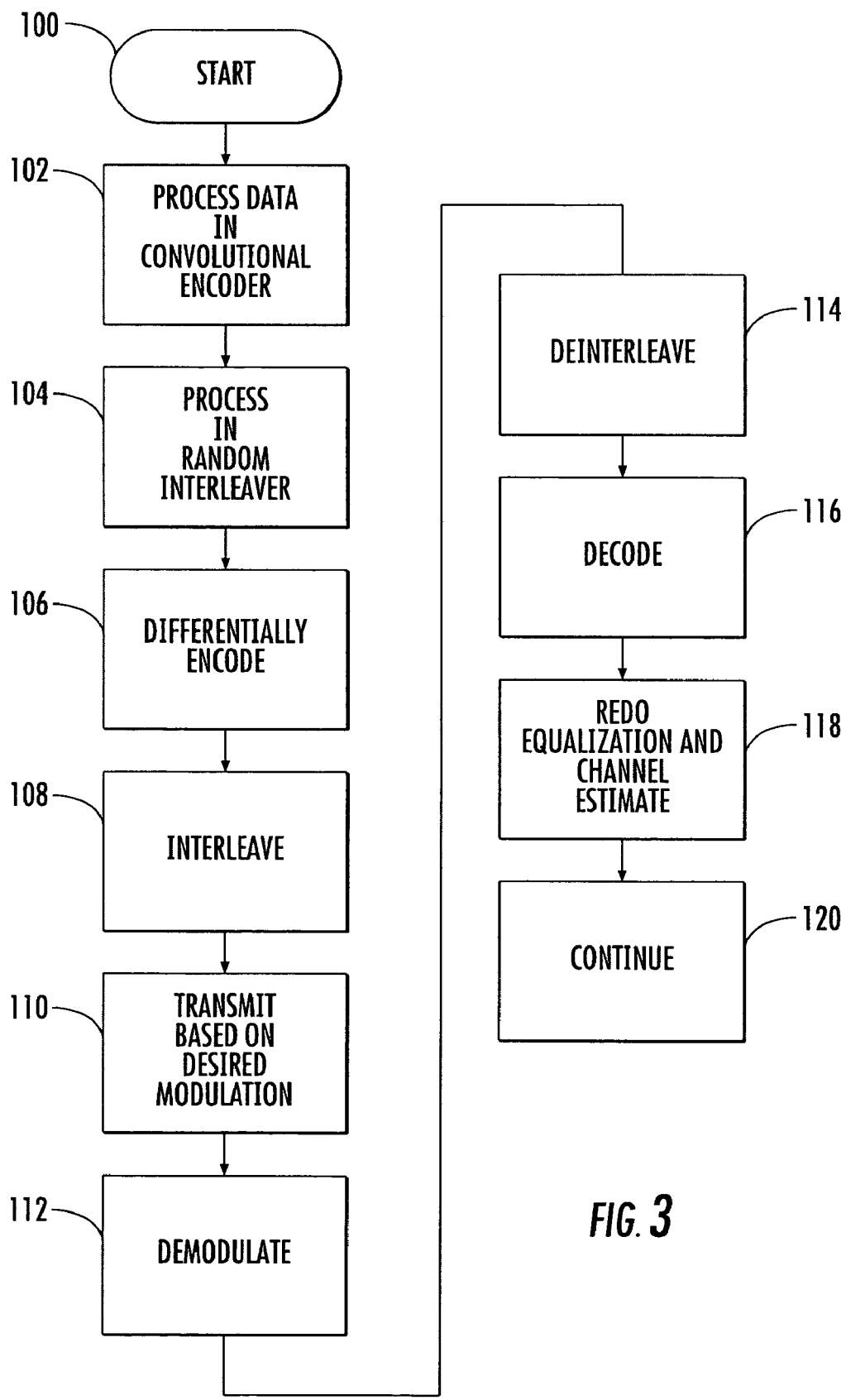
FIG. 3 is a high level flow chart showing an example of the system and method in accordance with the present invention.

FIG. 3 is a high level flow chart showing the processing for an example of a system and method in accordance with the present invention. The process starts (Block 100) and transmitted data is processed through a convolutional encoder (Block 102). Data can pass through a random interleaver (Block 104) and is differentially encoded with a rate one (1) code (Block 106). In sequence, the encoding could occur followed by random interleaving. The signal is passed through another interleaver (Block 108), and multiple bits are gathered to generate transmit symbols based on a desired modulation (Block 110), for example, the coherent M-PSK or M-QAM modulation. At the receiver, the signal is demodulated by a standard equalizer (Block 112) and passed through an inner deinterleaver (Block 114). The signal is iteratively decoded using an inner rate one (1) decoder and convolutional decoder in a turbo fashion (Block 116). With every few iterations, it is possible to re-do the equalizer and channel estimate (Block 118) (using "new" information from turbo process) and continue the process (Block 120).

Figure 4:
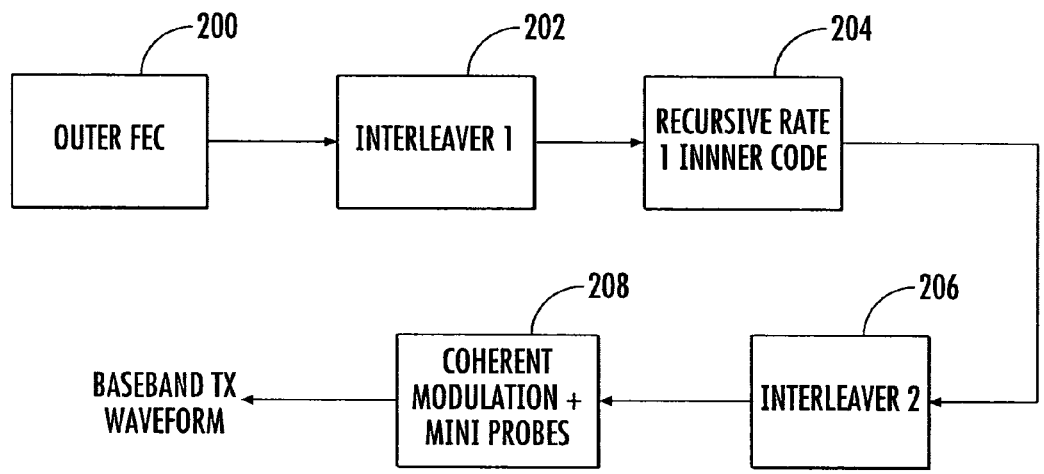
FIG. 4 is a block diagram of an example of a transmit section of the communications system in accordance with the present invention.

FIG. 4 is a block diagram of an example of a transmit system that can be used in accordance with the present invention. An outer Forward Error Correction (FEC) circuit 200 is operative with a first interleaver 202 followed by a circuit 204 that provides a recursive rate one (1) inner code with the data. This circuit 204 is operatively connected to a second interleaver 206, which separates bits such that the correlated multi-path and fading does not affect adjacent bits. A coherent modulation circuit 208 is operative with mini-probe sequences and receives the data from the interleaver 206 and creates a baseband waveform for transmission.

Mini-probe sequences are often used for channels where severe fading is expected. For example, alternating blocks of unknown data symbols and known mini-probe sequences, sometimes only a single symbol, are transmitted following a preamble sequence. The alternation of data blocks and mini-probe sequences can continue to the end of a transmission, or the initial preamble can be reinserted in a regular manner. In some systems, a time-of-day driven cryptographic device can select a preamble and mini-probe sequence from pseudo-random sequences. A good set of pseudo-random sequences used as either the mini-probes or preambles can be located. A mini-probe generation and algorithm can be used to generate a set of mini-probes.

Figure 5:
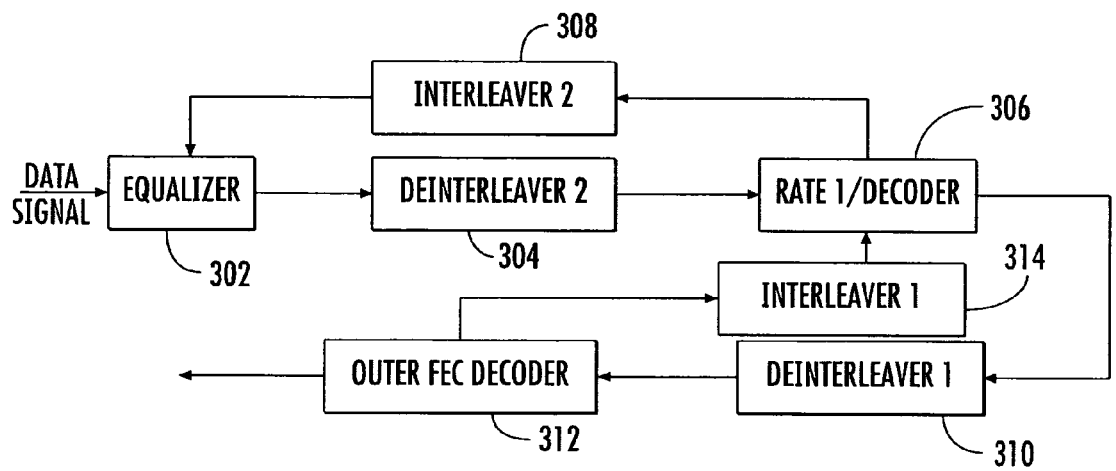
FIG. 5 is block diagram of a receive section of the communications system in accordance with the present invention.

FIG. 5 is a block diagram of a receive system 300 of the present invention. The data signal is received within an equalizer 302 and passes into a deinterleaver circuit 304 and into a rate one (1) decoder 306. Part of the signal is fed back into a second interleaver 308 and back into the equalizer 302. The signal from the rate one (1) decoder also passes into a deinterleaver 310 and through an outer Forward Error Correction (FEC) decoder 312 and fed back into an interleaver 314, which is operative with the Rate 1 decoder 306. A signal from the outer Forward Error Correction (FEC) decoder 312 is output as a first signal.

These circuits can include a Digital Signal Processor (DSP) or Field Programmable Gate Array (FPGA) operative with a pseudo-random interleaver. Any Forward Error Correction circuits can be operative with convolutional codes or other codes to generate soft information. It should be understood that implementation of various functions could occur within a Digital Signal Processor. Any interleaver could be operative as a pseudo-random interleaver. Convolutional Forward Error Correction (FEC) codes could be used as block codes, and a rate 1 inner code could be a rate 1 convolutional code with a Soft-In-Soft-Out (SISO) decoder.

It is evident that the present invention overcomes the disadvantages of differential modulation that has been used as an inner code. This causes degradation because of the differential scheme which can be avoided because the modulation can be coherent. The recursive nature of the inner code has provided significant gains in parallel and serially-concatenated iterative codes that can provide advantageous benefits.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A system for communicating data comprising:
   a transmitter, comprising
   an outer encoder for encoding data with a convolutional code;
   a first interleaver that receives encoded data from the outer encoder and interleaves the data randomly;
   an inner encoder that receives data from the first interleaver for encoding data with a recursive inner rate one code;
   a second interleaver that receives the encoded data from the inner encoder to interleave the data to aid in removing correlation of multipath fading channels on consecutive bits;
   a modulator for coherently modulating the communications signal that carries the data that has been encoded by the outer and inner encoders and interleaved by first and second interleavers comprising a cryptographic device for known symbols to aid in tracking at a receiver any multipath fading channels; and a receiver that receives the communications signal from the transmitter, and comprising an equalizer and an inner deinterleaver followed by a rate 1 decoder having a feedback and including an inner interleaver in the feedback wherein a portion of the signal from the rate 1 decoder is fed back to the inner interleaver and back into the equalizer, said receiver further comprising an outer deinterleaver that receives the signal from the rate 1 decoder followed by an outer forward error correction decoder having a feedback and outer interleaver in the feedback, wherein a portion of the signal is fed back from the outer forward error correction decoder into the outer interleaver and back into the rate 1 decoder such that the inner rate 1 code and outer convolutional code are iteratively decoded in turbo fashion and any equalization is redone with iterations by feeding back the latest demodulated symbol estimates resulting from the turbo process and continuing the turbo decoding process with improved equalizer estimates.

2. A system according to claim 1, wherein said equalizer and decoder are operative for iteratively decoding any convolutional code in a turbo fashion.

3. A system according to claim 1, which further comprises an interleaver and deinterleaver operative with said equalizer and inner decoder.

4. A system according to claim 3, which further comprises first and second interleavers and deinterleavers circuit operative with said equalizer and inner rate one decoder and further comprising a convolutional decoder operative with the first and second interleaver and deinterleaver circuit.

5. A system according to claim 3, wherein said equalizer, inner rate one decoder, deinterleaver and interleaver are operative for equalizing after every few iterations.

6. A system according to claim 1, and further comprising a convolutional encoder followed by a random interleaver and operative with said inner rate one encoder and modulator.

7. A system according to claim 1, wherein said modulator is operative with mini probe sequences.

* * * * *